United States Patent [19]
Van Roozendaal et al.

[11] Patent Number: 5,281,841
[45] Date of Patent: Jan. 25, 1994

[54] ESD PROTECTION ELEMENT FOR CMOS INTEGRATED CIRCUIT

[75] Inventors: Leonardus J. Van Roozendaal; René G. M. Penning de Vries, both of Eindhoven, Netherlands

[73] Assignee: U.S. Philips Corporation, Tarrytown, N.Y.

[21] Appl. No.: 933,864

[22] Filed: Aug. 21, 1992

Related U.S. Application Data

[63] Continuation of Ser. No. 679,972, Apr. 3, 1991, abandoned.

[30] Foreign Application Priority Data

Apr. 6, 1990 [GB] United Kingdom ............... 9007875

[51] Int. Cl.⁵ .................. H01L 23/62; H01L 23/48; H01L 23/52
[52] U.S. Cl. .................. 257/360; 257/357; 257/769; 257/770
[58] Field of Search .............. 357/23.3, 23.4, 23.13; 257/355, 356, 357, 360, 768, 769, 770

[56] References Cited

U.S. PATENT DOCUMENTS

| | | | |
|---|---|---|---|
| 4,644,386 | 2/1987 | Nishizawa et al. | 357/23.3 |
| 4,788,160 | 11/1988 | Havemann et al. | 357/23.3 |
| 4,825,280 | 4/1989 | Chen et al. | 257/489 |
| 4,855,620 | 8/1989 | Duvvury et al. | 257/357 |
| 4,873,557 | 10/1989 | Kita | 357/23.3 |
| 4,922,311 | 5/1990 | Lee et al. | 357/23.3 |
| 4,928,163 | 5/1990 | Yoshida et al. | 357/23.3 |
| 5,019,878 | 5/1991 | Yang et al. | 357/23.3 |
| 5,028,554 | 7/1991 | Kita | 357/23.3 |

FOREIGN PATENT DOCUMENTS

| | | | |
|---|---|---|---|
| 57-190359 | 11/1982 | Japan | 357/23.13 |
| 61-214474 | 9/1986 | Japan | 357/23.3 |
| 61-255069 | 11/1986 | Japan | 357/23.3 |
| 63-12168 | 1/1988 | Japan | 357/23.3 |
| 63-292678 | 11/1988 | Japan | 357/23.3 |
| 63-296278 | 12/1988 | Japan | 357/23.3 |

*Primary Examiner*—Rolf Hille
*Assistant Examiner*—Steven Loke
*Attorney, Agent, or Firm*—Steven R. Biren

[57] ABSTRACT

A semiconductor device (1) includes a circuit having at least one transistor Tr1 and first and second electrodes (30) and (32). A protection element (20) having a device region (21) forming a pn junction (23) within the semiconductor body (10) and covered by an electrode layer (21c) is connected via an electrode (27) to one (30) of the first and second electrodes for providing a conductive path between the first and second electrodes (30) and (32) when a voltage above a threshold voltage is applied to the first electrode (30). The electrode layer (21c) forms with at least part (21a) of the device region (21) a potential barrier (B) for causing the conductive path provided by the protection element (20) to pass from the electrode (27) to the pn junction (23) at least partly via the device region (21) of the protection element (20) thereby increasing the resistance of the path to the pn junction (23).

11 Claims, 3 Drawing Sheets

ESD PROTECTION ELEMENT FOR CMOS INTEGRATED CIRCUIT

This is a continuation of application Ser. No. 07/679,972, filed Apr. 3, 1991 abandoned.

BACKGROUND OF THE INVENTION

This invention relates to a semiconductor device comprising a semiconductor body having device regions defining at least one transistor with first and second electrodes and a protection element having a device region forming a pn junction within the semiconductor body and covered by an electrode layer connected via an electrode to one of the first and second electrodes for providing a conductive path between the first and second electrodes when a voltage above a threshold voltage is applied to the first electrode.

Such a protection device is provided for protecting the transistor and other device elements against the excessive voltages which may arise when, for example, the semiconductor device is subjected to an electrostatic discharge such as may arise when the semiconductor device or one of its connector pins is accidently touched by a person. The protection element is designed to provide a good conductive path during the application of such an excessive voltage so as to prevent damage to or destruction of the semiconductor device and to return to its normal non-conducting state when the excessive voltage is removed.

The subject of ESD (ElectroStatic Discharge) protection for CMOS integrated circuits is described in, for example, a paper entitled 'ESD protection reliability in 1 μm CMOS technologies' by C. Duvuury et al published in the proceedings of the IEEE International Reliability Physics Symposium Volume IRPS-86 at pages 199-205.

As the packing density of integrated circuits increases and thus the size of the individual transistors is reduced, the importance of forming good low-resistance contacts increases. As discussed in the aforementioned paper, it is conventional to provide an electrode layer, usually in the form of a metal silicide layer, on a device region to be contacted to improve the electrical connection to the subsequent contact metallization. However, the provision of such electrode layers severely degrades the performance of ESD protection devices within the integrated circuits as explained in the aforementioned paper. It has been proposed, as set out in, for example, the English language Abstract for Japanese Patent Application Publication No. JP-A-63-70553 to reduce this problem by masking the area of the ESD protection devices during the formation of the metal silicide electrode layer. This, however, introduces an additional masking stage into the manufacturing process, so increasing costs.

SUMMARY OF THE INVENTION

It is an aim of the present invention to provide a semiconductor device having a protection element in which the effect of the presence of electrode layers for reducing contact resistance on the performance of the protection element is reduced without having to mask the protection element during the processing to form the electrode layer.

According to the present invention, there is provided a semiconductor device comprising a semiconductor body having device regions defining at least one transistor with first and second electrodes and a protection element having a device region forming a pn junction within the semiconductor body and covered by an electrode layer connected via an electrode to one of the first and second electrodes for providing a conductive path between the first and second electrodes when a voltage above a threshold voltage is applied to the first electrode, characterized in that the electrode layer forms with at least part of the device region of the protection element a potential barrier for causing the conductive path provided by the protection element to pass from the electrode to the pn junction at least partly via the device region of the protection element.

Thus, in a semiconductor device in accordance with the invention the electrode layer forms with at least part of the device region of the protection element a potential barrier which causes the cor ductive path provided by the protection element to pass at least partly via the device region of the protection element thereby providing a resistance in series with the diode formed by the pn junction of the protection element. This results in a protection element which is more reliable and provides better protection against electrostatic discharge. It is believed that this arises because the overall resistance between the electrode of the protection element and the diode formed by the pn junction of the protection element is increased by virtue of the presence of the potential barrier, so reducing the effect of resistance variations and of current crowding which might otherwise occur.

The protection element may be in the form of a lateral insulated gate field effect transistor in which case the device region will form the drain region of the lateral insulated gate field effect transistor. The source region of such a lateral insulated gate field effect transistor may form an ohmic contact with an associated electrode layer. Alternatively, the source region may have a similar structure to the drain region so that the electrode layer associated with the source region forms a similar potential barrier with the source region. This has the advantage of limiting current crowding because of the potential barrier formed with the source region electrode layer.

The device region of the protection element may comprise a relatively highly doped subsidiary region forming an ohmic contact with the electrode layer and a relatively lowly doped subsidiary region forming the potential barrier with the electrode layer.

The relatively highly doped subsidiary region is usually provided within the relatively lowly doped subsidiary region which may, where the protection element is in the form of a lateral insulated gate field effect transistor, provide a lowly doped drain extension region. The relatively highly doped subsidiary region may be bounded by oxide (which may be formed by a local oxidation process) which may serve to increase the overall length of the conductive path through the device region of the protection element and thus the overall series resistance.

A further relatively highly doped subsidiary region forming an ohmic contact with the electrode layer may be provided within the relatively lowly doped region spaced from the other relatively highly doped region so enabling the overall series resistance between the protection element electrode and the diode formed by the pn junction to be adjusted as desired merely by altering the relative dimensions of the additional relatively highly doped subsidiary region without having to adjust doping concentrations.

The device region of the protection element may further comprise a relatively lowly doped well region deeper than the relatively lowly doped subsidiary region. The relatively lowly doped well region may serve to assist in preventing spiking, that is preventing diffusion into the semiconductor body of the electrode metallization, which might otherwise cause undesired shorting of the device region to the semiconductor body or substrate.

The potential barrier formed by the electrode layer generally comprises a Schottky barrier although, depending upon the dopant concentration of the relatively lowly doped subsidiary region, the potential barrier may form a leaky Schottky diode, effectively a diode with a high ohmic resistance. Generally, the electrode layer comprises a metal silicide layer such as titanium or platinum silicide although it is possible that other materials, for example metal layers, could be used to form the electrode layer. Where the protection element is a lateral insulated gate field effect transistor and the source region has a similar structure to the drain region, then the electrode layer associated with the source region may be formed of the same material and have the same properties as the electrode layer associated with the drain region.

BRIEF DESCRIPTION OF THE DRAWING

Embodiments of the invention will now be described, by way of example, with reference to the accompanying drawing, in which.

DESCRIPTION OF THE PREFERRED EMBODIMENTS

Figure 1:
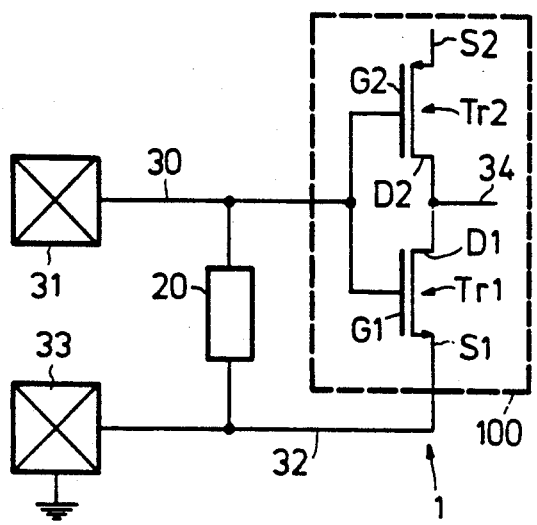
FIG. 1 is a simplified circuit diagram of a semiconductor device having a protection element.

It should of course be understood that the Figures are merely diagrammatic and that in particular FIGS. 2,3,6,8 and 10 are not to scale, relative dimensions or particular thicknesses of regions and layers having been exaggerated in the interests of clarity.

Referring now to the drawings, especially FIGS. 2,3,6,8 and 10, there is illustrated a semiconductor device 1 comprising a semiconductor body 10 having device regions 2,3,4,5,6,7 defining at least one transistor Tr1, with first and second electrodes 30 and 32 and a protection element 20 having a device region 21 forming a pn junction 23 within the semiconductor body 10 and covered by an electrode layer 21c connected via an electrode 27 to one 30 of the first and second electrodes for providing a conductive path between the first and second electrodes 30 and 32 when a voltage V above a threshold voltage $V_{bd}$ is applied to the first electrode 30.

Figure 6:
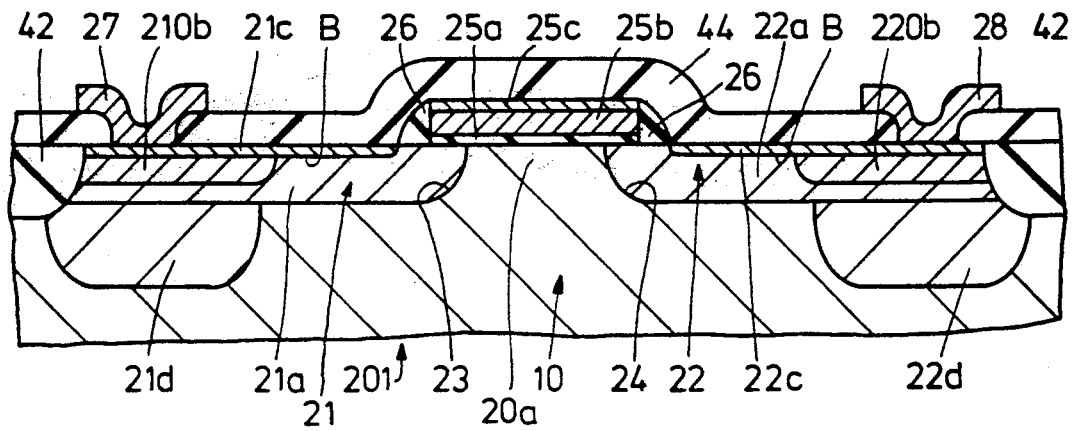
FIG. 6 is a schematic cross-sectional view of a first embodiment of a protection element for a semiconductor device in accordance with the invention.
Figure 8:
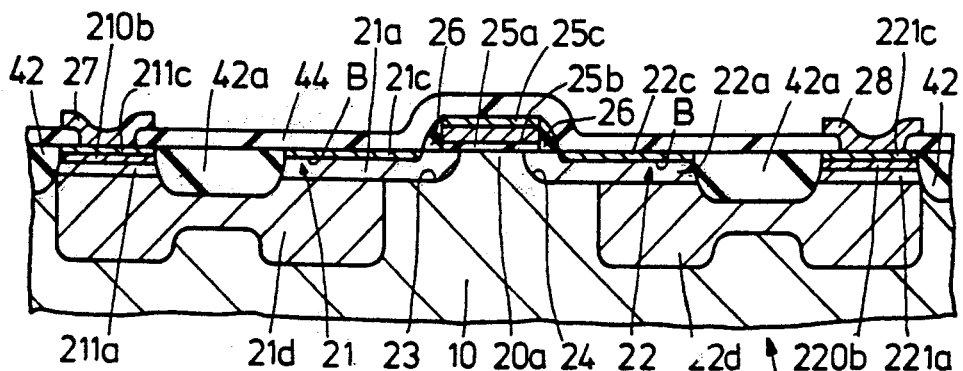
FIG. 8 is a schematic cross-sectional view of a second embodiment of a protection element for a semiconductor device in accordance with the invention.
Figure 10:
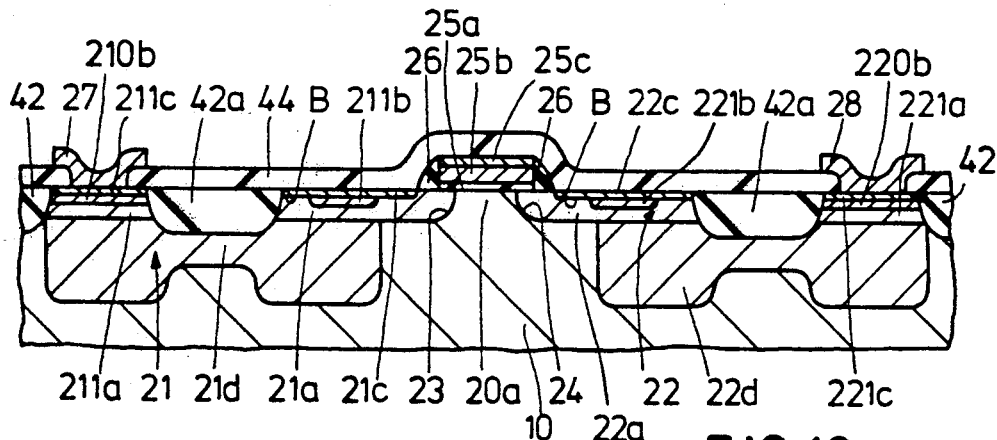
FIG. 10 is a schematic cross-sectional view of a third embodiment of a protection element for a semiconductor device in accordance with the invention.

In accordance with the invention, as illustrated in FIGS. 6,8 and 10, the electrode layer 21c forms with at least part 21a of the device region 21 of the protection element 20 a potential barrier B for causing the conductive path provided by the protection element 20 to pass from the electrode 27 to the pn junction 23 at least partly via the device region 21 of the protection element 20.

Thus, in a semiconductor device in accordance with the invention, the electrode layer 21c forms with at least part 21a of the device region 21 of the protection element a potential barrier B which causes the conductive path provided by the protection element 20 to pass at least partly via the device region 21 of the protection element 20 thereby providing, as will be explained in detail below, a resistance in series with the diode formed by the pn junction 23 of the protection element 20. This results in a protection element which is more reliable and provides better protection against electrostatic discharge. It is believed that this arises because the overall resistance between the electrode 27 of the protection element 20 and the diode formed by the pn junction 23 of the protection element 20 is increased by virtue of the presence of the potential barrier B which encourages current to flow through the more resistive device region 21 rather than through the electrode layer 21c in operation of the protection element 20, so reducing the effect of resistance variations and of current crowding which might otherwise occur.

In order to facilitate understanding of the present invention, an explanation and discussion of a known protection element will now be given with reference to FIGS. 1 to 5 in which FIG. 1 is a circuit diagram of a semiconductor device 1 having a protection element 20.

In the example shown in FIG. 1, the semiconductor device comprises a simple CMOS (complementary MOS) inverter circuit 100 formed by an n-channel transistor Tr1 and a p-channel transistor Tr2. It will, of course, be appreciated by those skilled in the art that the present invention may be applied to other or more complex CMOS circuits and also to other types of integrated circuits although the use of protection elements is of particular importance for CMOS circuits because of their susceptibility to damage by, for example, electrostatic discharge (ESD).

In accordance with the conventional inverter circuit configuration, the gate electrodes G1 and G2 of the inverter circuit 100 shown in FIG. 1 are connected in common to a first input line or electrode 30 which is itself connected to a first bond pad 31. The source S1 of the n-channel transistor Tr1 is similarly connected, via a second input line or electrode 32 to a second grounded bond pad 33 while the drains D1 and D2 of the transistors Tr1 and Tr2 are connected in common to an output line or electrode 34. The protection element 20 (to be described in detail below) is connected between the first and second electrodes 30 and 32.

Figure 2:
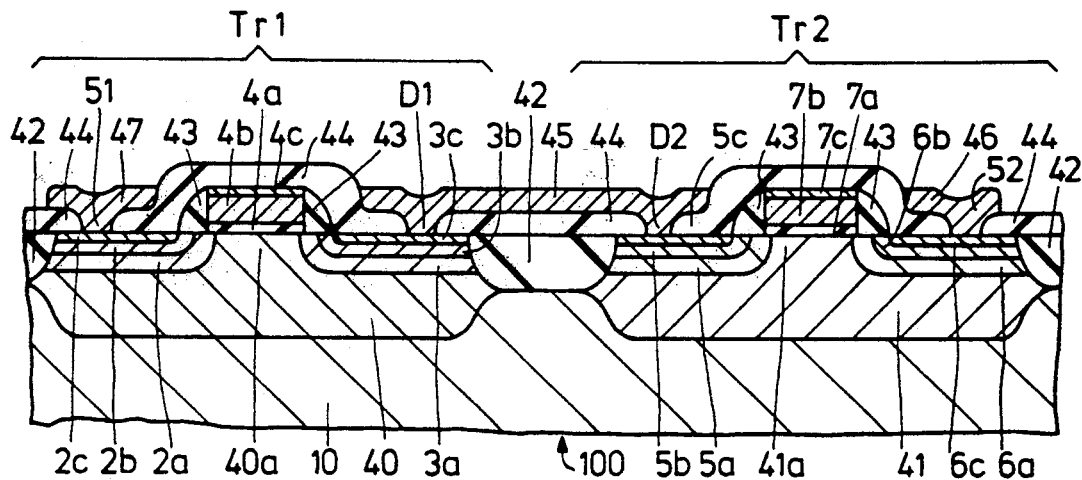
FIG. 2 is a schematic cross-sectional view of part of a semiconductor body forming the device shown in FIG. 1 illustrating transistors providing the CMOS inverter shown in FIG. 1.

The CMOS inverter circuit shown in FIG. 1 is, as can be seen from FIG. 2, formed in conventional manner within a monocrystalline silicon semiconductor body 10 which in this example is of p conductivity type having a boron dopant concentration of about $10^{15}$ atoms cm$^{-3}$. The n-channel transistor Tr1 is formed within a p conductivity type well region 40 while the p-channel transistor Tr2 is formed within an n conductivity type well region 41 with the areas of the transistors Tr1 and Tr2 defined by oxide regions 42 sunk into the semiconductor body 10 and formed by known local oxidation of silicon techniques.

The n-channel transistor Tr1 has n conductivity type source and drain regions 2 and 3 separated by a channel region 40a of the p-conductivity type well region 40 over which lies an insulated gate structure 4. In this example, each of the source and drain regions 2 and 3 comprises a relatively lowly doped subsidiary region 2a,3a and a more highly doped subsidiary region 2b,3b within the respective relatively lightly doped subsidiary region 2a,3a. it may, however, be preferable to omit the lowly doped subsidiary region 2a from the source region 2 so as to reduce the resistance and thus the potential difference between the insulated gate structure 4 and the source region 2, so assisting in avoiding gate oxide breakdown type problems. The relatively lightly doped subsidiary drain region 3a serves, in known manner, to avoid undesired short-channel effects, such as hot-carrier degradation which adversely affects the lifetime of the transistor. The p-channel transistor Tr2 may similarly have source and drain regions 5 and 6 each having a relatively lowly doped subsidiary region 5a and 6a and a relatively highly doped subsidiary region 5b and 6b although the lowly doped subsidiary regions 5a and 6a may be omitted in the case of the p-channel transistor Tr2. An insulated gate structure 7 overlies a channel region 41a of the n-conductivity type well region 41 between the source and drain regions 5 and 6 to provide a gateable connection between the source and drain regions 5 and 6.

The insulated gate structures 4, 7 are similar, each consisting of, in this example, a thin thermal oxide layer 4a, 7a and an overlying conductive gate layer 4b, 7b formed by polycrystalline silicon doped, in known manner, during the introduction of the impurities to form the n-channel source and drain regions 2 and 3. The source and drain regions 2,3,5 and 6 of the transistors Tr1 and Tr2 are formed in known manner by self-alignment to the insulated gate structures 4 and 7. In order to space the relatively highly doped subsidiary regions 2b, 3b,5b and 6b from the edges of the insulated gate structures 4 and 7, an insulating spacer region 43 is provided on the edges of the insulated gate structures 4 and 7 by anisotropic etching of a deposited oxide layer after introduction of the impurities to form the relatively lowly doped regions 2a and 3a or 5a and 6a of the respective transistor Tr1 or Tr2. Of course, if the relatively lowly doped subsidiary regions 5a and 6a are omitted from the p-channel transistor Tr2, then the impurities for forming the relatively highly doped source and drain regions 5b and 6b should be introduced before formation of the insulating spacer regions 43.

As mentioned above, as the packing density of integrated circuits increases and thus the dimensions of the individual device elements becomes smaller, the necessity to form good ohmic contacts to the desired device regions is increased. Accordingly, after formation of the relatively highly doped subsidiary regions 2b,3b,5b and 6b, the exposed surface areas of the device regions are subjected to a silicidation process in which, in known manner, a metal layer, for example a titanium layer, is deposited and then heated in an appropriate ambient atmosphere so as to cause silicide formation at the exposed surface areas of the device regions.

In the case of titanium, the ambient atmosphere comprises nitrogen which sets up a competing reaction forming titanium nitride so that in those areas where the silicon surface is not exposed, for example over oxide, only titanium nitride is formed. The titanium nitride can subsequently be selectively removed leaving titanium silicide only on the exposed silicon areas. Thus, silicide is formed in a self-aligned manner, without the need for a mask, to provide electrode layers 2c,3c,4c,5c,6c and 7c on the device regions.

Windows are formed in a covering deposited oxide layer 44, for example a TEOS layer, to enable subsequent metallization, in this case aluminum, to contact the device regions. To prevent aluminium migration into the semiconductor body 10, a thin layer of titanium-tungsten (not shown) may be provided on the silicide layer. Also, after formation of the thin titanium-tungsten layer, the contact hole may be filled with tungsten (not shown) before deposition of the metallization. Although, only the metallization 45 connecting the drain regions D1 and D2, the metallization 46 for enabling connection to the source region S2 of the p-channel transistor Tr2 and the metallization 47 for connecting the source region S1 of the n-channel transistor Tr1 to the electrode 32 are shown, it will, of course, be appreciated that appropriate connections are also made to the insulated gates G1 and G2.

Figure 3:
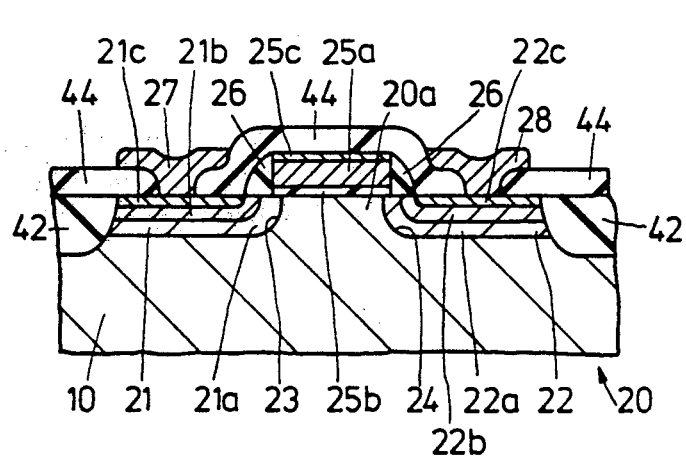
FIG. 3 is a schematic cross-sectional view of part of a semiconductor body showing a conventional protection element.

FIG. 3 is a cross-sectional view illustrating a typical known protection element 20. In this example, the protection element 20 is in the form of a gate-source connected lateral NMOS structure bounded by oxide regions 42 and having two device regions 21 and 22 forming the drain and source regions, respectively, of the lateral NMOS and each forming a respective pn junction 23 and 24 with the semiconductor body 10. It will of course be appreciated that other types of protection elements, for example simple diodes, may be used.

The most cost-effective way of forming the protection element 20 is simultaneously with the remainder of the semiconductor device by appropriate modification of the masking layers. Accordingly, as shown in FIG. 3, the drain and source regions 21 and 22 of the lateral NMOS transistor each have a relatively lowly doped subsidiary region 21a and 22a formed with the relatively lowly doped subsidiary regions 2a and 3a of the n-channel transistor Tr1 and relatively highly doped subsidiary regions 21b and 22b formed with the relatively highly doped subsidiary regions 2b and 3b. In addition, the lateral NMOS transistor has its insulated gate structure 25 overlying a channel area 20a of the semiconductor body 10 and formed at the same time as the insulated gate structures 4 and 7 and has similar associated spacer regions 26. In order to avoid the use of an additional mask which would increase manufacturing time and costs, the device regions 21,22 and 25 of the protection element 20 are also provided with an electrode layer 21c,22c and 25c in the form of a metal silicide layer. Again, the relatively lowly doped subsidiary region 22a may be omitted from the source region 22.

Again windows formed in the insulating layer 43 enable the metallization to provide electrodes 27 and 28 contacting the drain and source regions 21 and 22 to allow the protection element 20 to connect with the first and second electrodes 30 and 32. Although not shown in the Figures, the metallization connects the insulated gate structure 25 of the protection element 20 to its source electrode 28.

During normal operation of the semiconductor device 1, a voltage between about 0 and 5 volts is applied to the gate electrode 30. If a considerably higher voltage is inadvertently applied to the electrode 30, for example because of an electrostatic discharge, this could damage the transistors Tr1 and Tr2, for example by causing dielectric breakdown of the insulated gate structures 4 and 7 which might even result in a permanent short circuit.

In order to avoid such problems, the protection element 20 connected between the first and second electrodes 30 and 32 is designed to provide a conductive path to earth (ground) via the bond pad 33 when the voltage applied to the first electrode 30 exceeds a threshold voltage $V_{bd}$ which may be selected to be between about 10 and 15 volts.

Figure 4:
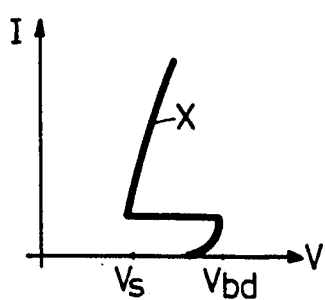
FIG. 4 is a graph for illustrating the operation of the protection element.

FIG. 4 illustrates graphically the relationship X between voltage V applied to the protection element 20 and the current I through the protection element.

In normal operation of the semiconductor device 1 when the voltage applied to the first electrode 30 is below the threshold voltage $V_{bd}$, the pn junction 23 of the device region 21 is reverse-brassed so that, apart from a small leakage current, the protection element 20 is effectively non-conducting. However, if the voltage applied to the first electrode 30 and thus to the device region 21 of the protection element 20, is increased beyond the breakdown voltage $V_{bd}$ of the pn junction 23, avalanche breakdown will occur resulting in a relatively large hole current to the semiconductor body or substrate 10. The pn junction 23 is designed to have a breakdown voltage $V_{bd}$ equivalent to that of the desired threshold voltage. This injection of holes into the semiconductor body 10 may become sufficient to forward-bias the pn junction 24 which then injects electrons into the substrate 10 so resulting in parasitic bipolar transistor action causing the voltage across the pn junction 23 to decrease to the so-called sustaining voltage $V_s$ illustrated in FIG. 4. In this so-called 'snap-back model', the protection element 20 provides, as described in 'A Ochoa et al IEEE Transactions on Nuclear Science Vol. NS-30 at pages 4127–4130 December 1983', a good conductive path between the first and second electrodes 30 and 32, thus protecting the gates of the inverter circuit 100 from the effects of the overvoltage.

As mentioned above, the device regions of the inverter circuit 100 and thus of the protection element 20 have metal silicide electrode layers 2c,3c and 4c, 21c, 22c and 25c to improve, that is reduce, the contact resistance between the metallization and the device regions. It has, however, been found that these metal silicide layers considerably reduce the reliability of the protection element 20 and that a protection element having such metal silicide layers is irreparably damaged at a considerably lower voltage-current strength, or after a considerably smaller number of electrostatic discharges, than an identical device which does not have the metal silicide layers.

Figure 5:
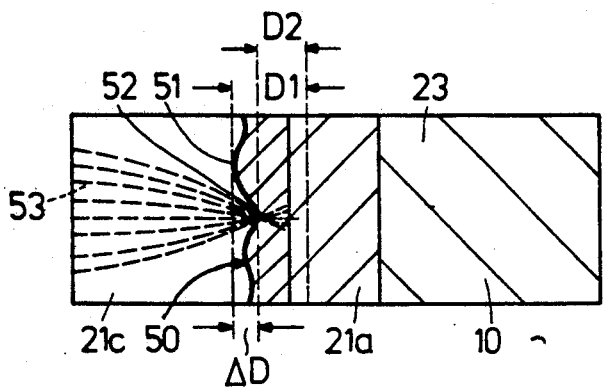
FIG. 5 is a schematic sectional view through part of the protection element shown in FIG. 3.

FIG. 5 is a sectional view taken perpendicular to the cross-section shown in FIG. 3 and through the metal silicide layer 21c of part of the protection element 20 for illustrating the effect of the metal silicide layer 21c.

As can be seen clearly from FIG. 5, the transition or boundary 50 between the metal silicide layer 21c and the adjoining semiconductor body 10 can be rather irregular so that at certain areas 51 the distance D1 from the edge of the metal silicide layer 21c is greater than the equivalent distance D2 at other areas 52. As the relatively lowly doped subsidiary region 21a of the protection element 20 is more resistive than the silicide layer 21c, this introduces resistance variations across the conductive path from the electrode 27 to the pn junction 23 which may result, as indicated by the dashed lines 53 in FIG. 5, in current crowding as the current takes the least resistive path towards the pn junction 23. If the current density exceeds a given maximum, then the pn junction 23 can be irreparably damaged, for example by a short-circuit caused by fusion due to local overheating. Because of this current crowding the maximum current which can flow safely through the protection element is much smaller than would be the case if the current distribution were more uniform.

In order to alleviate the above-mentioned problems, in a semiconductor device in accordance with the invention, the electrode layer 21c of the protection element 20 forms with at least part 210b of the device region 21 of the protection element a potential barrier B for causing the conductive path provided by the protection element 20 to pass from the electrode 27 to the pn junction 23 at least partly via the device region 21 of the protection element 20 rather than via the electrode layer 21c. Because the device region 21 is more resistive than the electrode layer 21c, the introduction of the potential barrier B increases the resistance of the conductive path from the electrode 27 to the pn junction 23 which has the effect of diminishing the influence of any variations in resistance caused by unevenness of the border or edge 31.

FIG. 6 is a cross-sectional view through a first embodiment of a protection element 201 of a semiconductor device in accordance with the invention.

The protection element 201, like that shown in FIG. 3, is a source-gate connected lateral NMOS transistor which is formed simultaneously with the other elements of the semiconductor device, for example the CMOS inverter shown in FIGS. 1 and 2, by appropriate mask modification.

Thus, the protection element 201 shown in FIG. 6 is bounded by oxide regions 42 and comprises drain and source regions 21 and 22 each having a relatively lowly doped subsidiary region 21a,22a and a relatively highly doped subsidiary region 210b,220b and an insulated gate structure 25 formed as described above. Each exposed device region 21,22 and 25 is covered by an electrode layer 21c,22c and 25c in the form of a layer of metal silicide. The lateral NMOS transistor 201 shown in FIG. 6 also has relatively deep relatively lowly doped n conductivity type well regions 21d and 22d from which the relatively lowly doped subsidiary regions 21a and 22a extend. The well regions 21d and 22d are not essential but assist in avoiding spiking, that is the shorting of the source or drain region to the semiconductor body or substrate 10 caused by diffusion of the metallization material through the source or drain region into the substrate or semiconductor body 10. The well regions 21d and 22d may be formed at the same time as the n-conductivity type well region 41 of the p-channel transistor Tr2 of the CMOS inverter.

In this example, the potential barrier B between the electrode layer 21c and the associated drain region 21 is provided by virtue of the fact that the relatively highly doped subsidiary region 210b is modified, by use of an appropriate mask during the introduction of the impurities, so as to extend only part way towards the insulated gate structure 25 so that adjacent to the insulated gate structure 25, the relatively lowly doped subsidiary region 21a meets the surface of the semiconductor body 10.

In the example shown in FIG. 6, the lateral NMOS 20 is symmetrical about the insulated gate structure 25 so that the source region 22 similarly has a modified relatively highly doped subsidiary region 220b enabling the relatively lowly doped subsidiary region 22a to provide a potential barrier B with the electrode layer 22c. The dopant concentration at the surface of the relatively lowly doped subsidiary regions 21a,22a is not sufficiently high to provide an ohmic contact to the respective electrode layer 21c,22c and accordingly a potential barrier B is provided at the interface between the electrode layer 21c,22c and the relatively lowly doped subsidiary region 21a,22a.

The potential barrier B provides a Schottky diode $D_S$ (see FIG. 7) at the interface between the relatively lowly doped subsidiary region 21a,22a and the associated electrode layer 21c,22c. The quality of the Schottky diode $D_S$ will depend upon the dopant concentration of the relatively lowly doped subsidiary region 21a,22a and on the barrier height $\phi_B$ which is related to the material forming the electrode layer 21c,22c.

When the electrode layers 21c,22c are formed of titanium silicide, then the barrier height $\phi_B$ will be about 0.60 V. The barrier height determines the leakage current of the diode which at a temperature of 300 K. (Kelvin) will be about $10^{-3}$ Acm$^{-2}$ for titanium silicide. If the dopant concentration of the relatively lowly doped subsidiary regions 21a and 22a is less than or equal to about $10^{17}$ cm$^{-3}$ then a true Schottky diode is provided at the potential barrier. Typically, in the processes used for forming the CMOS circuit 100, the dopant concentration will be in the region of 2 to $3 \times 10^{18}$ cm$^{-3}$ so that the interface between the relatively lowly doped subsidiary region 21a,22a and the associated electrode layer 21c,22c provides a leaky Schottky diode that is a Schottky diode in series with a high-ohmic resistor. Of course, the dopant concentration of the relatively lowly doped subsidiary region 21a,22a could be reduced to improve the quality of the diode $D_S$.

Figure 7:
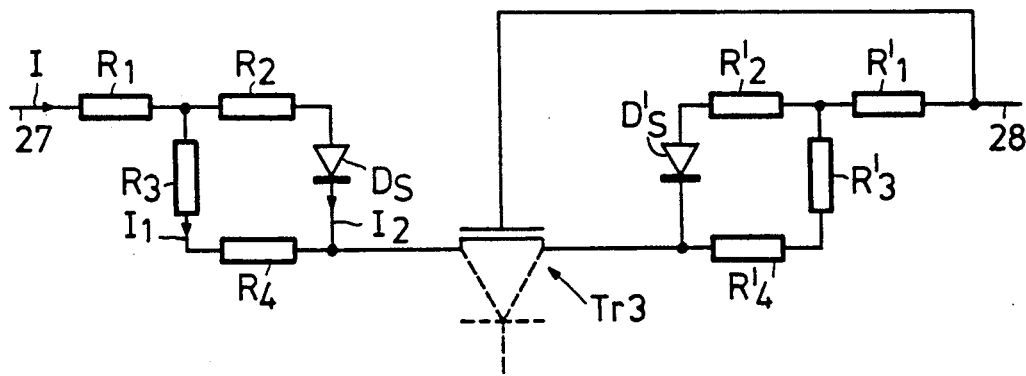
FIG. 7 illustrates an equivalent circuit diagram for the protection element shown in FIG. 6.

The operation of the protection element 201 shown in FIG. 6 will now described with the assistance of FIG. 7 which illustrates a so-called lumped model illustrating an equivalent circuit for the protection element shown in FIG. 6 in which $R_1$ and $R_2$ are the resistances of the electrode layer 21c interfacing with the relatively highly doped subsidiary region 210b and the relatively lowly doped subsidiary region 21a, respectively, $R_3$ is the resistance of the conductive path from the electrode layer 21c via the relatively highly doped subsidiary region 210b, $R_4$ is the resistance of the resistive path through the relatively lowly doped subsidiary region 21a to the pn junction 23, $D_S$ is the Schottky diode, and Tr3 is the lateral NMOS transistor in parallel with the potential parasitic bipolar transistor (shown in phantom lines in FIG. 7) formed by the drain region 21, the semiconductor body 10 and the source region 22.

In normal operation of the semiconductor device, the protection element 201, will like the protection element 20 of FIG. 3, remain non-conducting until the threshold voltage $V_{bd}$ is exceeded on electrode 30. When the threshold voltage is exceeded, the drain-side reverse-biassed pn junction 23 breaks down by avalanche breakdown as described above. Sufficient hole current may be provided into the semiconductor body 10 to cause parasitic bipolar action (indicated by the phantom bipolar transistor symbol in FIG. 7). Current will thus flow from the electrode 27 to the pn junction 23 with, of course, the highest current passing along the path of least resistance.

The Schottky diode $D_S$ providing the potential barrier B at the interface of the electrode layer 21c with the relatively lowly doped subsidiary region 21a serves to limit the current $I_2$ entering the relatively lowly doped subsidiary region 21a from the electrode layer 21c provided that (given that the resistance $R_2$ through the electrode layer 21c is low) the combined resistance $R_3+R_4$ through the relatively highly doped subsidiary region 210b and the relatively lowly doped subsidiary region 21a is sufficiently low that the potential drop along the resistances $R_3+R_4$ is less than the potential barrier B.

As noted above with reference to FIG. 5, the weak area where any current crowding may occur is the uneven boundary 50 of the electrode layer 21c adjacent the spacer region 26, that is where the current $I_2$ leaves the electrode layer 21c. However, a significant proportion of the total current I will flow through this weak area only if the potential difference across the resistors $R_3$ and $R_4$ is greater than 0.6 volts. If the relatively lowly doped subsidiary region 21a is formed so as to be relatively short in the direction of the conductive path but relatively wide perpendicular to the conductive path, so that the resistance $R_3+R_4$ is relatively small, the current $I_1$ through the relatively lowly doped subsidiary region 21a will be significant before the diode $D_S$ conducts. The current path through the relatively lowly doped subsidiary region 21a to the pn junction 23 is less subject to the current-crowding problems which arise where the main current path is via the uneven boundary 50 of the electrode layer and so provides better electrostatic discharge protection.

Removing the relatively highly doped subsidiary region in the vicinity of the insulated gate structure 25 of course results in a higher series resistance (which can be reduced by providing a wider channel area) and a higher reverse breakdown voltage which has to be taken into account when designing the protection circuit.

The lumped element diagram shown in FIG. 7 also illustrates the source side of the gate-source connected NMOS shown in FIG. 6. As the structure of the source region 22 shown in FIG. 6 is similar to that of the associated drain region 21, the lumped elements at the source side are shown by similar reference characters identified as $R'_1$ to $R'_4$, and $D_S'$ where each lumped element is equivalent to the correspondingly referenced element $R_1$ to $R_4$ and $D_S$ on the drain side.

FIG. 8 is a cross-sectional view of a second embodiment of a protection element 202 of a semiconductor device in accordance with the invention.

In this example, the relatively highly doped subsidiary regions 210b,220b are again modified so that adjacent the insulated gate structure 25, the electrode layers 21c,22c interface with the relatively lowly doped subsidiary regions 21a,22a to form potential barriers B. In this case, however, the modified relatively highly doped subsidiary regions 210b,220b are bounded by oxide by providing, by modifying the anti-oxidation mask used during definition of the local field oxide pattern 42, additional sunken oxide regions 42a. As can be seen from FIG. 8, after formation of the device regions 21 and 22, the additional oxide regions 42a extend through the relatively lowly doped subsidiary regions 21a,22a into the well regions 21d,22d (which are shallower beneath the additional oxide regions 42a by virtue of the masking effect), so dividing off or isolating a section 211a,221a of the relatively lowly doped subsidiary regions 21a and 22a and a corresponding section 211c and 221c of the electrode layers 21c and 22c beneath the electrodes 27 and 28.

Figure 9:
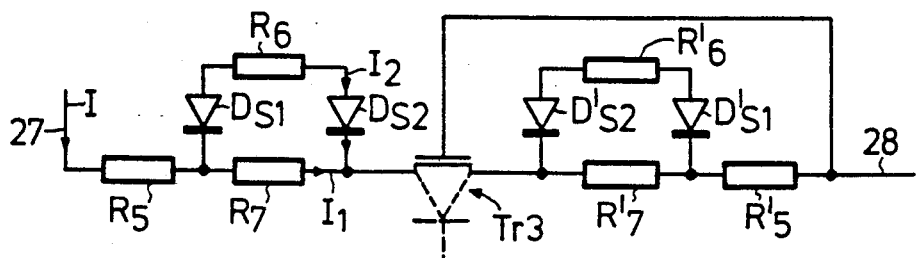
FIG. 9 illustrates an equivalent circuit diagram for the protection element shown in FIG. 8.

FIG. 9 illustrates a functional equivalent circuit or 'lumped model' for the protection element shown in FIG. 8. In this example, $R_5$, $R_6$ and $R_7$ represent the resistances provided by the well region 21d, the electrode layer 21c and the relatively lowly doped subsidiary region 21a while $D_{S1}$ and $D_{S2}$ represent the Schottky diodes provided at the interface of the section of the electrode layer 21c above the well region 21d and the relatively lowly doped subsidiary region 21a, respectively. Resistors $R'_5$, $R'_6$ and $R'_7$ and diodes $D'_{S1}$ and $D'_{S2}$ are the comparable components for the source side of the lateral NMOS protection element 20.

The protection element 202 operates in a manner similar to that shown in FIG. 6. There are two weak areas at the drain side of this device where current crowding may occur, namely at the electrode layer 21c interface with the relatively lowly doped subsidiary region 21a near the additional oxide region 42a and adjacent the spacer region 26 because in both cases the boundary or edge of the electrode layer 21c will be uneven. However, the current through these weak areas is limited. Thus, the current I will not flow directly via resistor $R_5$ from the n well region 21d into the electrode layer 21c because of the potential barrier provided by the reverse-biassed Schottky diode $D_{S1}$ formed adjacent the additional sunken oxide region 42a by the relatively lowly doped subsidiary region 21a and the electrode layer 21c. This limits or reduces the current which can flow into the electrode layer 21c from the well region 21d, so reducing the current through the electrode layer 21c.

The best situation in respect of FIG. 8 arises when the diode $D_{S1}$ does not breakdown during an ESD stress and this can be achieved by limiting the resistance $R_7$ so as to limit the potential drop across the diode $D_{S1}$, thereby causing the main current $I_1$ to flow via the resistors $R_5$ and $R_7$. Even if the diode $D_{S1}$ breaks down few problems are expected at the edge of the additional oxide region 42a because the built-in series resistance provided by the well region 21d will force a homogeneous current flow through the diode $D_{S1}$. The current through the weak area adjacent the spacer region 26, that is at the uneven boundary or edge 50 of the electrode layer 21c, is limited in the same way as described above with reference to FIG. 6 because the least resistive path is provided via the resistance $R_7$ formed lowly doped subsidiary region 21a.

In this example, the current through the electrode layer 21c is limited, as mentioned above, because of the reverse-biassed Schottky diode $D_{S1}$. If, however, the reverse avalanche or breakdown voltage of the Schottky diode $D_{S1}$ is reached, this current in the electrode layer 21c will increase. However, the current $I_1$ has first to flow through the relatively lowly doped subsidiary region 21a (resistances $R_5$ and $R_7$) before a potential difference is developed across the Schottky diode $D_{S1}$ so that the ESD performance is again increased. If, however, this potential difference does reach the reverse avalanche potential of the diode $D_{S1}$ then the current $I_2$ through the electrode layer 21c will increase and will stay at a high level (no 'snap back' effect as shown in FIG. 4) after avalanche breakdown has occurred. In order to limit the current $I_2$ through the electrode layer 21c, the resistance $R_7$ should be as small as possible. This can be achieved by making the well region 21d relatively short, that is by providing only a small spacing between the additional oxide region 42a and the spacer region 26.

FIG. 10 is a cross-sectional view of a third embodiment of a protection element 203 of a semiconductor device in accordance with the invention.

As can be seen from a comparison of FIGS. 8 and 10, the protection element 20 shown in FIG. 10 differs from that of FIG. 8 in that an additional highly doped subsidiary region 211b is provided within the relatively lowly doped subsidiary region 21a between and spaced from the additional oxide region 42a and the insulated gate structure 25. Again, as shown in FIG. 10, the source region 22 has a similar structure to the drain region 21 so that an additional highly doped subsidiary region 221b is also provided for the source region 22.

Figure 11:
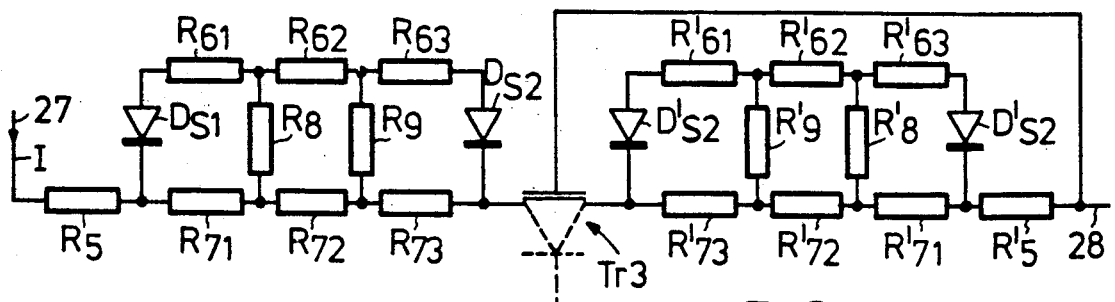
FIG. 11 illustrates an equivalent circuit diagram for the protection element shown in FIG. 10.

FIG. 11 illustrates the functional equivalent circuit or 'lumped model' for the protection element shown in FIG. 10. In this case, the resistors $R_6$ and $R_7$ are replaced by a network of resistors $R_{61}$, $R_{62}$, $R_{63}$, being a series of resistances with the electrode layer 21c over the relatively lowly doped subsidiary region 21a, the additional relatively highly doped subsidiary region 211b and the relatively lowly doped subsidiary region 21a and resistors $R_{71}$, $R_{72}$ and $R_{73}$ being the corresponding resistors in parallel within the relatively lowly doped subsidiary region 21a while resistors $R_8$ and $R_9$ are resistances via the additional relatively highly doped region 211b to the well region and the relatively lowly doped region 21a, respectively.

Again current through the weak areas adjacent the additional oxide region 42a and the spacer region 26 where the uneven edges of the electrode layer 21c may cause current crowding is limited. Thus, as mentioned above in relation to FIGS. 8 and 9, the current I will not flow directly from the n well region 21d into the electrode layer 21c adjacent the additional oxide region 42a because of the reverse-brassed Schottky diode $D_{S1}$. As in the case of the protection element shown in FIG. 8, the best situation arises when the diode $D_{S1}$ does not breakdown during an ESD stress and this can be achieved by limiting the resistance $R_{71}$ so as to limit the potential drop across the Schottky diode $D_{S1}$. Even if the diode $D_{S1}$ breaks down few problems are expected at the uneven edge of the electrode layer 21c at the additional oxide region 42a because the built-in series resistance provided by the well region 21d will force a homogeneous current flow through the diode $D_{S1}$. The current through the uneven edge of the electrode layer 21c at the spacer region 26 is limited in the manner described for the protection element 201 shown in FIG. 6. For given length of the electrode layer 21c it is desirable that the additional relatively highly doped subsidiary region 211b be as long as possible in order to limit the resistances $R_{71}$ and $R_{73}$ (while still keeping $\Delta R/(R$ total) small) so that the potential drop across the resistances $R_{71}$ and $R_{73}$ is kept below that of the potential barrier provided by the Schottky diode $D_{S2}$.

The lateral NMOS or insulated gate field effect transistors shown in FIGS. 6,8 and 10 all have source regions 22 with similar structures to their drain regions. However, this need not necessarily be the case. Thus, the lowly doped subsidiary region 22a may be omitted from the source region 22 so that the electrode layer 22c forms an ohmic contact with the source region 22 and the potential barrier B is not provided. The presence of the potential barrier B at the source region 22 side of the device does however have the advantage of limiting current crowding because of the reverse-brassing of the Schottky diode ($D'_S$ in FIG. 6) formed with the electrode layer 22c.

Generally, a semiconductor device will have a fast response ESD protection element capable of carrying limited current, for example a lateral NMOS of the type discussed above, and a slower response ESD protection element capable of carrying higher currents. The slower response ESD protection element may be a lateral NMOS similar in structure to those described above but with a higher threshold voltage, by virtue of a thicker insulated gate oxide, and a higher breakdown voltage. In such circumstances, the insulated gate may be a metal gate provided at a field oxide region.

It will, of course, be appreciated that, where appropriate, p-channel rather than n-channel lateral MOS transistors may be used to form a protection element. Also, although the various examples given above are all MOS transistors, the principle of the present invention may be applied where the protection element is merely a diode (for example one half of FIGS. 6,8 and 10 with the insulated gate omitted) or where the protection element is in the form of a bipolar transistor with, in that case, the potential barrier B being provided at the interface between the electrode layer and the collector region.

From reading the present disclosure, other modifications will be apparent to persons skilled in the art. Such modifications may involve other features which are already known in the semiconductor art and which may be used instead of or in addition to features already described herein.

We claim:

1. A semiconductor device comprising a semiconductor body having device regions defining at least one transistor with first and second electrodes and a protection element having a device region forming a pn junction within the semiconductor body and covered by an electrode layer connected via an electrode to one of the first and second electrodes for providing a conductive path between the first and second electrodes when a voltage above a threshold voltage is applied to the first electrode, wherein the electrode layer forms with at least part of the device region of the protection element a potential barrier for causing the conductive path provided by the protection element to pass from the electrode to the pn junction at least partly via the device region of the protection element.

2. A semiconductor device according to claim 1, further characterized in that the device region of the protection element comprises a first relatively highly doped subsidiary region forming an ohmic contact with the electrode layer and a relatively lowly doped subsidiary region forming the potential barrier with the electrode layer.

3. A semiconductor device according to claim 2, further characterized in that the first relatively highly doped subsidiary region is provided within the relatively lowly doped subsidiary region.

4. A semiconductor device according to claim 3, further characterized in that the first relatively highly doped subsidiary region is at least partly bounded by oxide.

5. A semiconductor device according to claim 2, further characterized in that the device region of the protection element further comprises a relatively lowly doped well region deeper than the relatively lowly doped subsidiary region which extends beyond the well region.

6. A semiconductor device according to claim 2, further characterized in that a second relatively highly doped subsidiary region forming an ohmic contact with the electrode layer is provided within the relatively lowly doped subsidiary region spaced from the first relatively highly doped subsidiary region.

7. A semiconductor device according to claim 1, further characterized in that the potential barrier formed by the electrode layer comprises a Schottky barrier.

8. A semiconductor device according to claim 1, further characterized in that the electrode layer comprises a metal silicide layer.

9. A semiconductor device according to claim 8, further characterized in that at least one device region of the transistor is covered by a metal silicide layer.

10. A semiconductor device according to claim 1, further characterized in that the protection element comprises an insulated gate field effect transistor with the device region forming the drain region of the insulated gate field effect transistor.

11. A semiconductor device according to claim 10, further characterized in that the insulated gate field effect transistor has a source region covered with an electrode layer which forms a potential barrier with at least part of the source region.

* * * * *